US006756637B2

(12) United States Patent
Adkisson et al.

(10) Patent No.: US 6,756,637 B2
(45) Date of Patent: Jun. 29, 2004

(54) METHOD OF CONTROLLING FLOATING BODY EFFECTS IN AN ASYMMETRICAL SOI DEVICE

(75) Inventors: James W. Adkisson, Jericho, VT (US); Michael J. Hargrove, Clinton Corners, NY (US); Lyndon R. Logan, Essex Junction, VT (US); Isabel Y. Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/899,957

(22) Filed: Jul. 6, 2001

(65) Prior Publication Data

US 2003/0006459 A1 Jan. 9, 2003

(51) Int. Cl.⁷ .............................................. H01L 29/76
(52) U.S. Cl. ..................... 257/345; 257/344; 257/347; 257/408
(58) Field of Search ................................. 257/345, 336, 257/344, 408, 347; 438/302, 286, 583

(56) References Cited

U.S. PATENT DOCUMENTS

| | | | | | |
|---|---|---|---|---|---|
| 5,424,229 A | * | 6/1995 | Oyamatsu | ................ | 438/302 |
| 5,434,093 A | * | 7/1995 | Chau et al. | ................ | 438/305 |
| 5,943,576 A | * | 8/1999 | Kapoor | ................ | 438/302 |
| 6,190,980 B1 | * | 2/2001 | Yu et al. | ................ | 438/302 |
| 6,214,677 B1 | * | 4/2001 | Lee | ................ | 438/284 |
| 6,246,103 B1 | * | 6/2001 | Yu | ................ | 257/557 |
| 6,291,325 B1 | * | 9/2001 | Hsu | ................ | 438/525 |
| 6,420,761 B1 | * | 7/2002 | Gauthier, Jr. | ................ | 257/360 |
| 6,525,381 B1 | * | 2/2003 | Long et al. | ................ | 257/347 |
| 6,528,846 B1 | * | 3/2003 | Nowak | ................ | 257/347 |

OTHER PUBLICATIONS

A. Yagishita et al.; "High Performance Metal Gate MOSFETs Fabricated by CMP for 0.1μm Regime"; 0–7803–4774–9/98, 1998 IEEE; IEDM 98–785; pp. 29.3.1–29.3.4.*
T. Matsuki et al.; "Cu/Poly–Si Damascene Gate Structured MOSFET with Ta and TaN Staked Barrier"; 0–7803–5410–9/99, 1999 IEEE; IEDM 99–261; pp. 10.6.1–10.6.4.*
A. Hiroki et al.; "A High Performance .01μm MOSFET with Asymmetric Channel Profile"; 0–7803–2700–4, 1995 IEEE; IEDM 95–439; pp. 17.7.1–17.7.3.*
A. Yagishita et al.; "High Performance Damascene Metal Gate MOSFETs for 0.1μm Regime"; 0018–9383/00, 2000 IEEE Transaction on Electron Devices, vol. 47, No. 5; pp. 1028–1034.*

* cited by examiner

Primary Examiner—Michael Trinh
(74) Attorney, Agent, or Firm—Whitham, Curtis & Christofferson, P.C.; H. Daniel Schnurmann

(57) ABSTRACT

High performance asymmetric transistors including controllable diode characteristics at the source and/or drain are developed by supplying impurities with high accuracy of location by angled implants in a trench or diffusion from a solid body formed as a sidewall of doped material. High concentration gradient of impurities to support high performance is achieved by providing for reduced heat treatment after the impurity is supplied in order to limit diffusion previously necessary to achieve the desired location of impurity structures. Damascene or quasi-Damascene gate structures are also provided for high dimensional uniformity, increased manufacturing yield and structural integrity of the transistor.

10 Claims, 5 Drawing Sheets

METHOD OF CONTROLLING FLOATING BODY EFFECTS IN AN ASYMMETRICAL SOI DEVICE

BACKGROUND OF THE INVENTION

1. Field of the Invention

The present invention generally relates to semiconductor devices and integrated circuits formed on substrates containing an insulator layer such as silicon-on-insulator chip or wafer and, more particularly, to the control of floating body effects in transistors formed on such substrates.

2. Description of the Prior Art

Demands for increased performance, functionality and manufacturing economy for integrated circuits have resulted in extreme integration density to reduce signal propagation time and increase noise immunity while increasing the number of circuits and devices that can be formed on a chip or wafer by a single sequence of processes. Scaling of devices to small sizes has also restricted operating margins and required increased uniformity of electrical characteristics of semiconductor devices on a chip.

To satisfy this latter criterion, silicon-on-insulator (SOI) wafers have been used to exploit the improved quality of monocrystalline silicon provided thereby in an active layer formed on an insulator over a bulk silicon "handling" substrate. Similar attributes can be developed in similar structures of other semiconductor materials and alloys thereof. The improved quality of the semiconductor material of the active layer allows transistors and other devices to be scaled to extremely small sizes with good uniformity of electrical properties.

Unfortunately, the existence of the insulator layer which supports the development of the improved quality of semiconductor material also presents a problem known in the art as floating body effect in transistor structures. The floating body effect is specific to transistors formed on substrates having an insulator layer. The neutral floating body is electrically isolated by source/drain and halo extension regions that form oppositely poled diode junctions at the ends of the transistor conduction channel and floating body while the gate electrode is insulated from the conduction channel through a dielectric. The insulator layer in the substrate completes insulation of the conduction channel and thus prevents discharge of any charge that may develop in the floating body. Charge injection into the neutral body when the transistor is not conducting develops voltages in the conduction channel in accordance with the source and drain diode characteristics.

The voltage developed due to charge collection in the transistor conduction channel has the effect of altering the switching threshold of the transistor. This effect, in turn, alters the signal timing and signal propagation speed since any transistor will have a finite slew rate and the rise and fall time of signals is not instantaneous even when gate capacitance is very small. Therefore, the diode characteristics of the source and drain must be tailored to limit charge build-up in the floating body.

To do so, the diode junctions must be made somewhat leaky to allow the floating body of the transistor to be discharged to an acceptable degree. Unfortunately, since field effect transistors are generally formed symmetrically with identical source and drain impurity structures, development of such a characteristic reduces the ratio of resistance of the "on" and "off" states of the transistor, often referred to as the on/off ratio. A large on/off ratio is desirable to support maximum circuit fanout (the number of transistor gates a transistor can drive with acceptable switching speed) and to provide maximum signal voltage swing close to the power supply voltage. Therefore, there is a trade-off between limitation of floating body effects and maintaining a suitable on/off ratio.

While most known designs for field effect transistors are symmetrical, asymmetrical FETs have been proposed and investigated by simulation, but possibly not realized, for reduction of short channel and hot carrier effects and/or suppression of parasitic bipolar transistor effects (but not reduction of floating body effects), as reported, for example, in "An 0.1-$\mu$m Asymmetric Halo by Large-Angle-Tilt Implant (AHLATI) MOSFET for High Performance and Reliability" by Shin et al., IEEE Transactions on Electron Devices, Vol. 46, No. 4, April 1999, and "A High Performance 0.1 $\mu$m MOSFET with Asymmetric Channel Profile" by A. Hiroki et al. IEEE, 1995.

These approaches use angled implants which are asymmetrically placed due to shadowing by a (possibly dummy) gate structure and are largely characterized by substantial process complexity and diffusion of impurities over substantial distances which prevents the formation of sharp impurity concentration gradients and results in low precision of impurity structure placement. The proposed processes also do not provide for differences in impurity concentration between the source and drain but only differences in location. In summary, while some asymmetry is provided, the flexibility of design parameters in accordance with the proposed processes is very limited and, while source and drain characteristics may be made to differ somewhat, the diode characteristics cannot be accurately tailored or independently fabricated.

The approach to reduction of floating body effects at the present state of the art is to form a connection from the floating body/conduction channel to the source electrode through the impurity well. This approach is only a partial solution since the well can be highly resistive and the connection can be ineffective. Further, the connection requires additional chip space and therefore precludes achievement of the potential integration density that would otherwise be possible.

It is also known in fabrication of integrated circuits at very small feature size regimes to form conductive structures such as interconnects by a Damascene process; yielding structures of superior stability, accuracy and other mechanical properties. A Damascene process involves formation of a recess at a surface, depositing metal in the recess and planarizing the deposited metal to the surface. This produces a conductive structure of very precise dimensions and which is laterally supported at all times and is therefore particularly resistant to metal migration and damage in interconnect structures.

More recently, in an effort to achieve higher conductivity of gate structures, metal gates have been developed and a Damascene process has been proposed for fabrication of the same, as reported in, for example, "Damascene-Gate Thin Film Transistors with Ultra-Thin Gate Dielectrics" by E. Ma et al., IEEE 1998. However, process complexity is substantial and, moreover, metal gate transistors have been found to present difficulties in obtaining a desired work function difference between NMOS and PMOS devices.

A Damascene gate can also be used to allow formation of the gate dielectric and gate electrode subsequent to source and drain implantation with a dummy gate as reported in "Plasma Damage Free Gate Process Using Chemical Mechanical Polishing for 0.1 μm MOSFETs" by T. Saito et al., Japanese Journal of Applied Physics; April, 1999. However, since a dummy gate structure is used for source/drain implantation, substantial process complexity is required to obtain correct gate structure registration and the Damascene process must be performed after the source/drain implantation processes are complete. Moreover, use of a dummy gate structure cannot serve to increase location accuracy or concentration gradient of impurity structures such as halo and extension implants as discussed above.

SUMMARY OF THE INVENTION

It is therefore an object of the present invention to provide a method of fabricating a transistor on a SOI substrate which can be made substantially free of floating body effects by allowing tailoring of diode characteristics of the source and/or drain of the transistor.

It is another object of the invention to provide a simplified process for fabrication of an asymmetric field effect transistor which provides improved accuracy of location and concentration gradient of impurity structures for improved performance.

In order to accomplish these and other objects of the invention, a method of forming an asymmetric field effect transistor to control floating body effect and a transistor having reduced or eliminated floating body effects formed by such a process is provided wherein the method or process includes steps of defining a gate location with a trench in a dielectric layer on a semiconductor layer, supplying impurities to the semiconductor layer at edges of the trench and adjacent source and drain regions, and forming a gate structure on the semiconductor layer in the trench. The impurities are supplied by angled implantation and/or diffusion from a doped solid body formed in the trench to accurately locate desired impurities such that diffusion is not required to drive the impurities to a desired location; thus supporting steep impurity concentration gradients and high performance.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
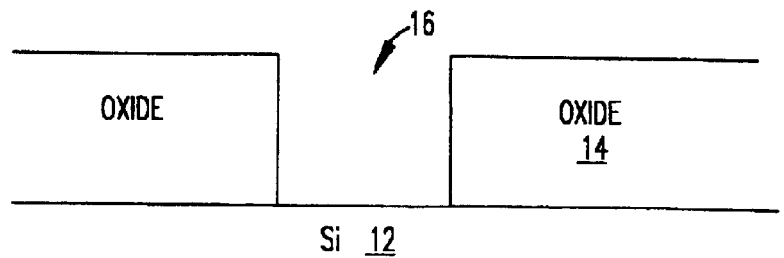
FIGS. 1, 2, 3 and 4 are cross-sectional views illustrating basic principles of the invention.

Referring now to the drawings, and more particularly to FIGS. 1–4, there is shown, in cross-section, sequential stages in the fabrication of a transistor in accordance with the invention and illustrating the basic principles of the invention in satisfying the above-noted and other objects. FIG. 1 shows the surface of a semiconductor substrate or other layer 12 with a patterned thick oxide layer 14 formed thereon. The patterning includes a trench or aperture 16 which is preferably formed lithographically using any suitable lithographic tool and process and is preferably of the desired final dimensions of the transistor gate. Deep ultraviolet or electron beam exposure is generally required for exposing features of current and foreseeable sizes where the advantages of the present invention are most evident. However, it should be understood that the invention may be applied to form transistors of any desired dimensions.

Figure 2:
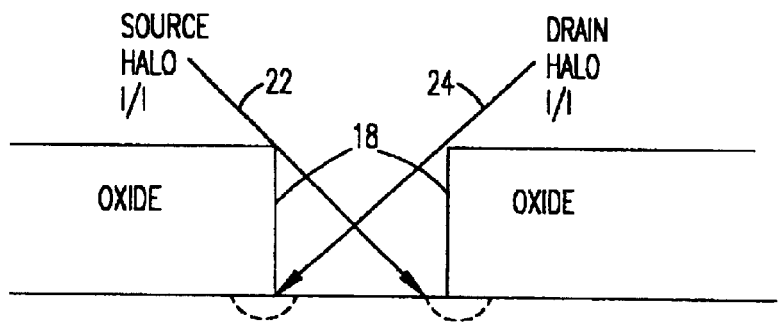

A basic principle of the invention is illustrated in FIG. 2. Using the trench structure of FIG. 1 rather than a gate structure as in the publications cited above, angled implants such as 22 and/or 24 may be made in sequence. The angle, generally in the range of 20° to 35° should be chosen in consideration of trench dimensions so that the shadow of the trench or aperture walls 18 expose only a desired relatively narrow region at the bottom of the trench 16. Angled implants 22 and/or 24 can be repeated at the same or different angles with impurities of the same or different conductivity type and appropriate energies to form extension, halo or any other type of impurity structure that may yield desired conduction properties in connection with dimensions, materials and other parameters of the transistor design.

It should be appreciated that the locations exposed by the shadow of walls 18 will be the locations generally desired for impurity structures which enhance or determine the conduction properties of the transistor channel which is exposed by the patterning 16 of the oxide 14. Therefore, the impurities can be directly implanted in the semiconductor layer 12 at precisely the desired location. The process is not complicated by implanting through another layer and the annealing process which follows the implantation can be limited to a heat treatment sufficient to activate the impurity and repair lattice damage but produce little, if any, diffusion. Therefore, impurity concentration gradients may be maintained and located with high accuracy and uniformity.

It should also be appreciated that angled implants 22 and 24 and any repetitions thereof are also completely decoupled from each other and independent. Therefore, the diode properties at the source and drain may be established independently, asymmetrically and with complete design flexibility. Further, except for changes of angle, energy and impurity type(s) the angled implant processes are identical and therefore do not significantly complicate the overall process and may serve to simplify the process relative to other possible alternatives while producing a transistor with potentially enhanced performance with improved reliability and yield as well as improved uniformity.

Figure 3:
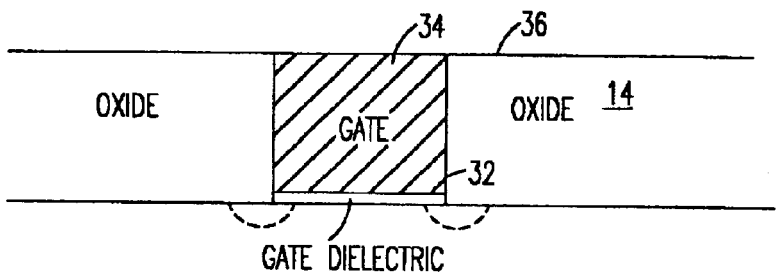
Figure 4:
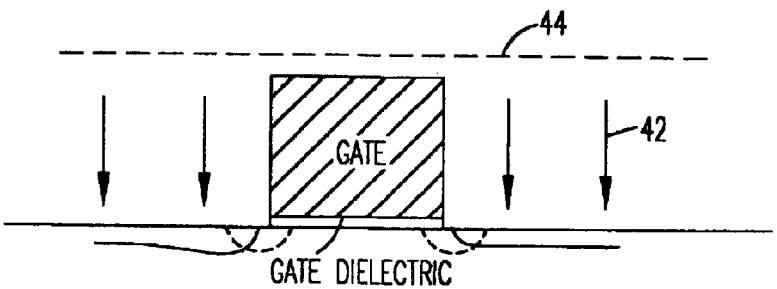

As shown in FIG. 3, the gate structure is completed by growing or depositing a gate dielectric 32 which may be oxide, nitride, composite and/or layered materials or high dielectric constant materials. The gate electrode 34 may then be deposited and planarized back to the surface 36 of oxide 14. The gate material may be either metal or doped polysilicon or other materials that will be evident to those skilled in the art. It should be noted that the structure shown in FIG. 3 is similar to a Damascene gate and oxide 14 could be left in place to form a Damascene gate if the source and drain implants had been done previously. However, this is not preferred since accuracy of the impurity structures could be compromised and other processes are available to obtain Damascene or quasi-Damascene gate structures if desired. (The term "quasi-Damascene" is used to denote structures which have the appearance of Damascene structures which may be formed in a recess as in a true Damascene process but where the final lateral support for the structure is provided after formation of the structure.)

The transistor is then completed by removal of oxide 14 and performing the drain and source implants as indicated at 42. A passivation layer of oxide or other insulator may then be applied to substantially complete the transistor. A thick oxide layer could be applied and planarized back to the gate 34 to yield a quasi-Damacene gate structure.

It should be noted that the process discussed above in connection with FIGS. 1–4 can be performed and the structure fabricated on any substrate, regardless of composition or construction. While the principal presently contemplated meritorious effects are directed to the avoidance of floating body effects in structures formed on an SOI substrate by allowing independent formation and tailoring of source and drain impurity structures such as halo and extension structures, such a capability of decoupling source and drain processing and other meritorious effects, such as developing of sharp impurity concentration gradients may be useful in other environments such as on substrates of silicon or other materials and which may or may not include an insulator or other structures. Therefore, it is intended that FIGS. 1–4 which illustrate the basic principles of the invention be understood as comprehending such other environments.

Referring now to FIGS. 5–10 a preferred embodiment of the invention will now be discussed. This process closely follows the process discussed above in connection with FIGS. 1–4 and discussion of portions the process of FIGS. 5–10 which are common to the generalized process of FIGS. 1–4 will be abbreviated or omitted.

Figure 5:
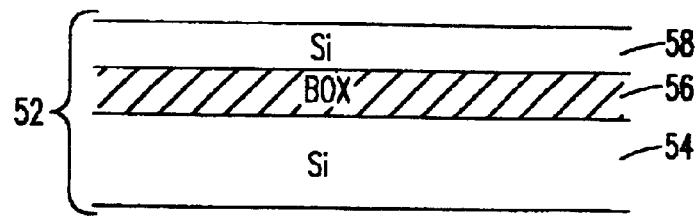
FIGS. 5, 6, 7, 8, 9 and 10 are cross-sectional views illustrating fabrication of a preferred embodiment of the invention.

FIG. 5 shows a cross-sectional view of an exemplary SOI wafer 52. Layer 54 is generally referred to as a handling substrate since, in general, its principal function is to provide mechanical support for insulator 56 and active silicon layer 58. However, it is known to form various structures thereon or therein to use the handling layer 54 as a heat sink, an electrically active device, a passive electronic region such as shielding or a ground plane and the like. Multiple pairs of insulator and active or passive silicon layers can also be included, as desired.

Figure 6:
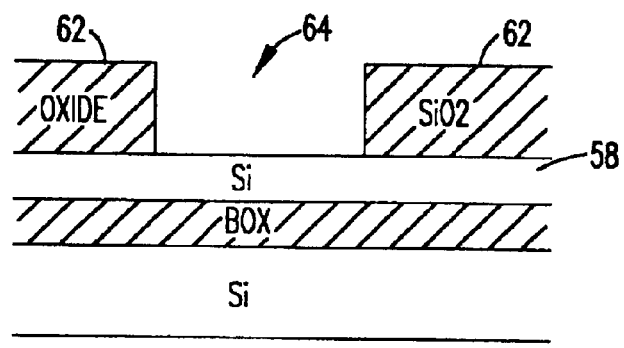
Figure 7:
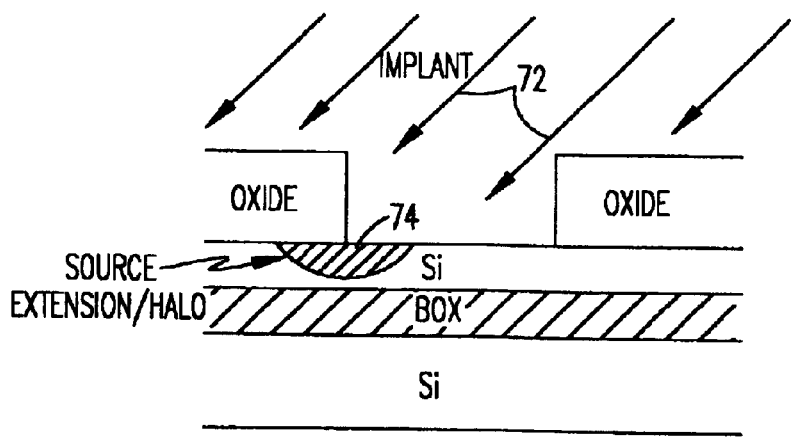
Figure 8:
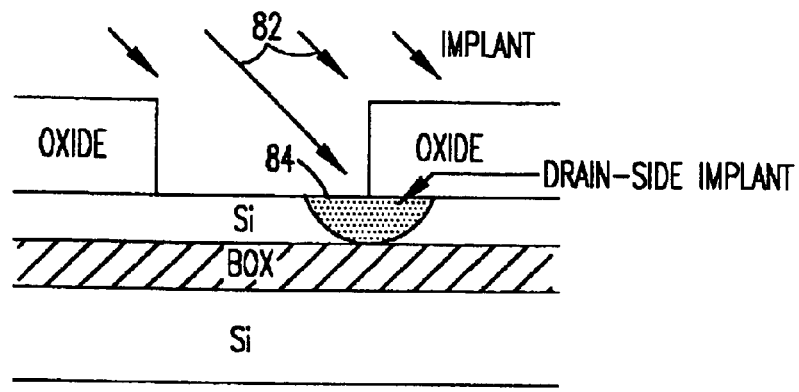

As shown in FIG. 6, a thick dielectric film 62 is deposited and patterned to form a trench 64 to the active silicon layer 58. Then, as shown in FIG. 7, an angled implant 72 is performed to form an extension and/or halo structure 74 on the source side. These structures can be formed concurrently or sequentially at the same or different implant angles and energies; the location being determined by the implant angle and the shadow formed by thick oxide 62 within aperture 64. Similarly, as shown in FIG. 8, halo and/or implant structures 84 are formed concurrently or sequentially by angled. implants 82 at the drain side. The process illustrated in FIG. 8 may precede or follow that of FIG. 7 or sequential parts of both can be interleaved in any desired manner. In any case or order of processes or partial processes, including annealing for impurity activation and/or annealing which can be performed after any implant, the formation of impurity structures at the source and drain sides of the transistor are completely decoupled and the diode junction at either or both sides can be tailored precisely as desired.

Figure 9:
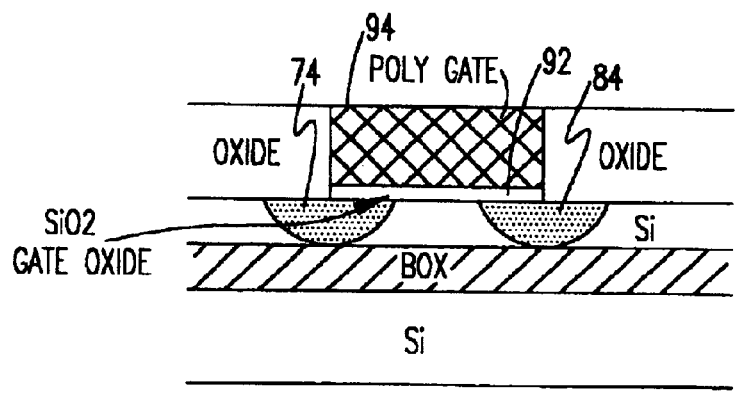
Figure 10:
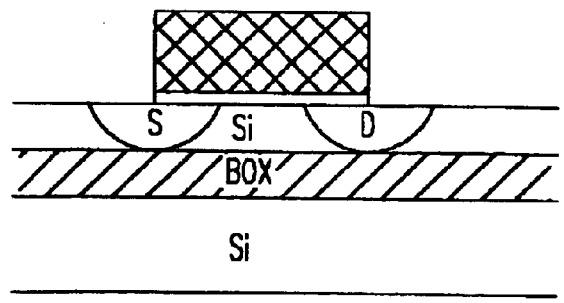

Then, as shown in FIGS. 9 and 10, the gate oxide or other gate insulator 92 can be deposited or grown and gate electrode 94 formed. Then, if source and drain regions have not been previously formed, thick oxide 62 can be removed and implants performed, followed by a final annealing process, as described above. The transistor is then completed using known processes as may be desired.

FIGS. 11–17 show a variant method for forming transistors in accordance with the invention. It should be understood that the principles of this variant method can be used in substitution for any portion or the entirety of the process discussed above in regard to FIGS. 7 and 8 and has the potential for developing different impurity distributions and/or concentration gradients than may be produced from the embodiment of FIGS. 5–10. In this regard, the embodiment of FIGS. 11–17 should be understood as illustrating a basic alternative principle of the invention that any or all angled implant(s) as described above can be replaced by diffusion from a solid body for any purpose addressed by the invention while maintaining the novel decoupling of formation of source and drain impurity structures.

Figure 11:
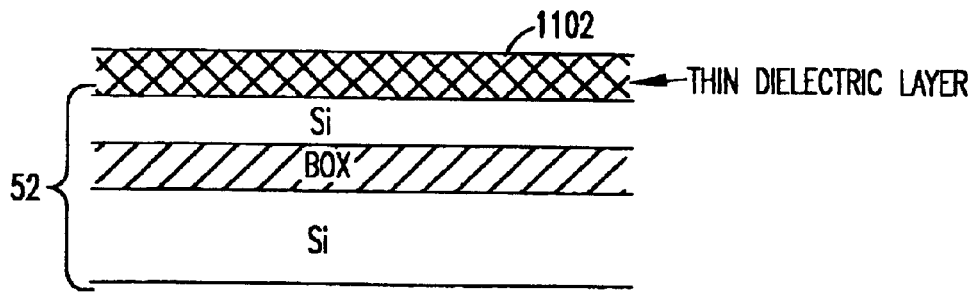
FIGS. 11, 12, 13, 14, 15, 16 and 17 are cross-sectional views illustrating an alternative method of fabricating the preferred embodiment of the invention and variations thereof.
Figure 12:
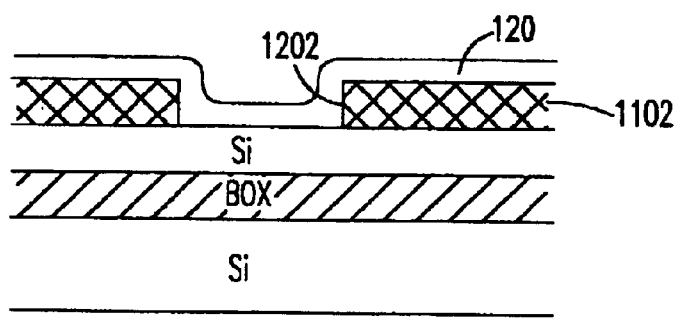

Starting with a wafer or wafer structure as illustrated in FIG. 1 or 5, FIG. 11 illustrates deposition of a thin oxide layer 1102. The thickness is not critical to the basic principles of the invention but should be chosen in connection with the width of sidewall which is to be formed in accordance with a given design in the trench 1202 patterned into the thin oxide (or other material) 1102, as shown in FIG. 12. A conformal layer of doped material such as an oxide is deposited thereon and anisotropically etched to form sidewalls. The thickness of the doped material layer should also be chosen in accordance with the width of sidewall to be developed as is well-understood in the art. These processes result in symmetrically formed spacers 1302 of doped material as illustrated in FIG. 13.

Figure 14:
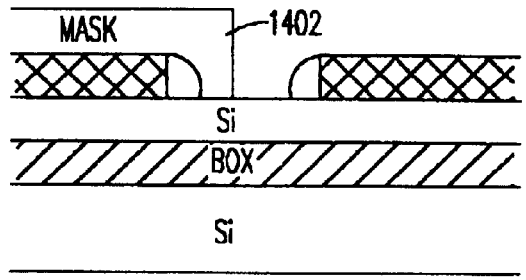
Figure 15:
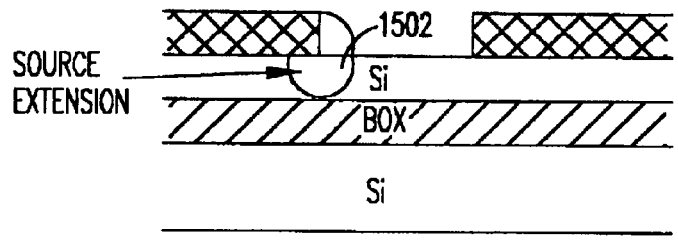

Then, as shown in FIG. 14, a resist is applied, exposed, developed and thus patterned to cover only one of spacers 1302. Registration may be somewhat critical for devices of small minimum feature size but it should be appreciated that the process window for exposure and registration of the mask edge is only slightly smaller than the minimum feature size and thus necessarily within the capacity of the exposure tool capable of other processes at similar resolution. One of spacers 1302 is thus removed by selectively etching while the other is protected by the resist, as shown in FIG. 15; after which dopant can be outdiffused from the remaining spacer solid body to form impurity structure 1502.

Figure 13:
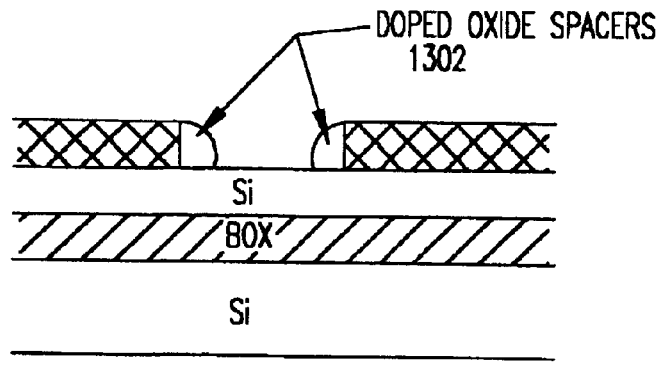
Figure 16:
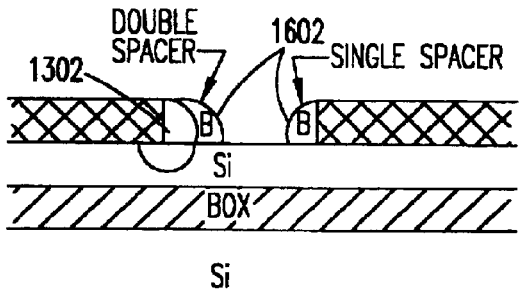
Figure 17:
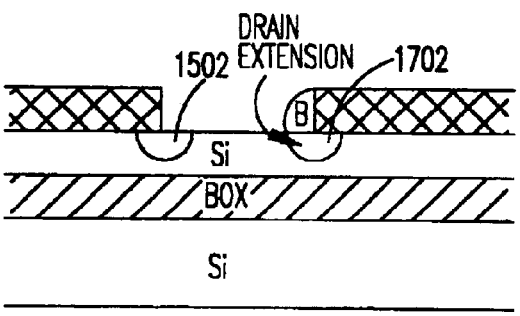

The process of FIGS. 12–14 can then be repeated using a differently doped material, with or without removal of spacer 1302 to form spacers 1602 as shown in FIG. 16 and one of the spacers 1602 can be removed by masking and etching, if desired, as shown in FIG. 17. Diffusion annealing can be performed immediately or combined with a later heat treatment, as may be desired or dictated by the device design. The spacers/diffusion sources can then be removed and the device completed as discussed above in connection with FIGS. 9 and 10.

In view of the foregoing, it is seen that the invention provides two techniques which may be used alternatively or in combination to decouple the formation of impurity structures at different locations in a semiconductor device such as a field effect transistor so that the diode characteristics thereof may be individually and accurately tailored for any desired purpose such as avoiding floating body effects when SOI substrates are employed for the formation of such transistors. The invention also provides a much simplified and accurate process for forming asymmetric transistors having high performance structures therein and which supports accurate location of impurity structure profiles and steep impurity concentration gradients.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An asymmetric field effect transistor comprising:

a semiconductor layer formed on an insulator layer, said semiconductor layer including impurities supplied thereto adjacent edges of a trench in a dielectric layer on said semiconductor layer and adjacent source and drain regions, wherein the impurities have locations precisely defined by respective edges of said trench and independently tailored concentrations to produce asymmetrical diode properties at said source and drain regions for reducing floating body effects without an additional connection between said semiconductor layer between said source and drain regions and a said source region of said asymmetric field effect transistor, and a gate structure formed on said semiconductor layer in said trench.

2. A transistor as recited in claim 1, the dielectric layer having been removed, and comprising source and drain impurity regions formed adjacent said gate structure.

3. A transistor as recited in claim 2, said source and drain impurity regions having been formed by impurity implantation.

4. A transistor as recited in claim 2, including a further insulator layer deposited over said source and drain regions and said gate structure.

5. A transistor as recited in claim 2, further including a further insulator layer deposited over at least said source and drain regions and planarized to said gate structure.

6. A transistor as recited in claim 1, wherein said gate structure is between said source and drain regions.

7. A transistor as recited in claim 6, wherein said gate structure is planarized to said dielectric layer.

8. A transistor as recited in claim 1, wherein impurities were supplied by angled implantation within said trench.

9. A transistor as recited in claim 1, including a sidewall within said trench.

10. A transistor as recited in claim 1, wherein said impurities have been supplied by diffusion from a sidewall formed of a doped material and located in said trench.

* * * * *